United States Patent
Takakura

[11] Patent Number: 6,097,074
[45] Date of Patent: *Aug. 1, 2000

[54] PHOTO SENSOR AND METHOD FOR FORMING THE SAME

[75] Inventor: Shinji Takakura, Kanagawa, Japan

[73] Assignee: Sony Corporation, Tokyo, Japan

[*] Notice: This patent is subject to a terminal disclaimer.

[21] Appl. No.: 08/863,354

[22] Filed: May 27, 1997

Related U.S. Application Data

[63] Continuation of application No. 08/489,875, Jun. 13, 1995, Pat. No. 5,898,209.

[30] Foreign Application Priority Data

Jun. 30, 1994 [JP] Japan .................................. 6-171838

[51] Int. Cl.[7] .............................. H01L 31/00; H01L 31/06
[52] U.S. Cl. .......................... 257/440; 257/443; 257/461
[58] Field of Search ..................................... 257/440, 443, 257/461, 464

[56] References Cited

U.S. PATENT DOCUMENTS 4,837,429 6/1989 Umezawa et al. ...................... 250/211

FOREIGN PATENT DOCUMENTS 60-97681 10/1985 Japan .
63-122267 10/1988 Japan .

*Primary Examiner*—Stephen D. Meier
*Attorney, Agent, or Firm*—Ronald P. Kananen; Rader, Fishman & Grauer

[57] ABSTRACT

A semiconductor photosensitive element comprises first and second photosensitive regions. The first photosensitive region is different from the second photosensitive region in its structure and thereby the first photosensitive region has photoelectric conversion characteristic and frequency characteristic which are different from those of the second photosensitive region. A method for forming a semiconductor photosensitive element includes steps of forming a high concentration impurity region of a first conductivity type and an element isolation region on a semiconductor of the first conductivity type, forming a semiconductor layer of a second conductivity type on the semiconductor substrate and high concentration impurity region, thereby to form a first photosensitive region formed of the high concentration impurity region 10 formed on the semiconductor substrate and the photoelectric conversion layer consisting of the semiconductor layer and a second photosensitive region formed of the photoelectric conversion layer consisting of the semiconductor layer formed on the semiconductor substrate.

8 Claims, 14 Drawing Sheets

F I G. 3A
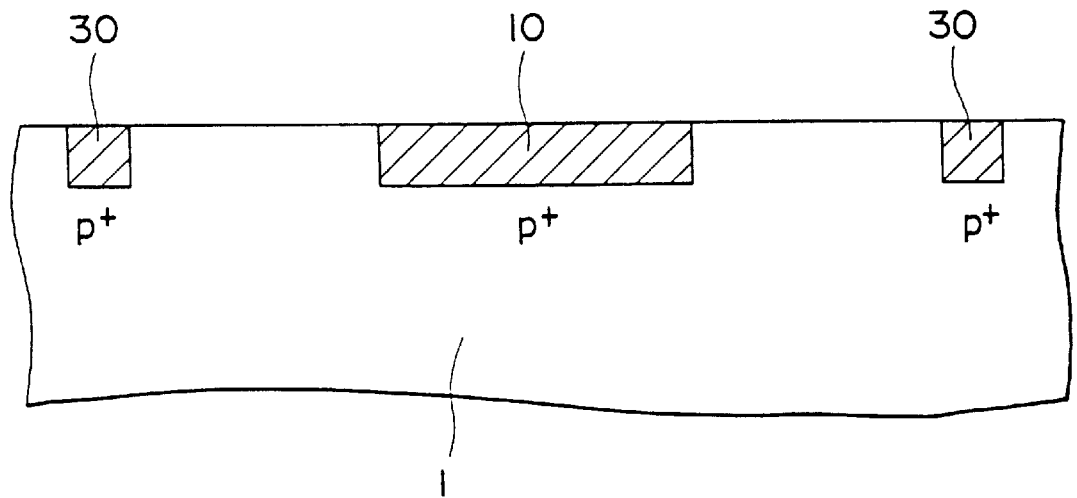
F I G. 3B
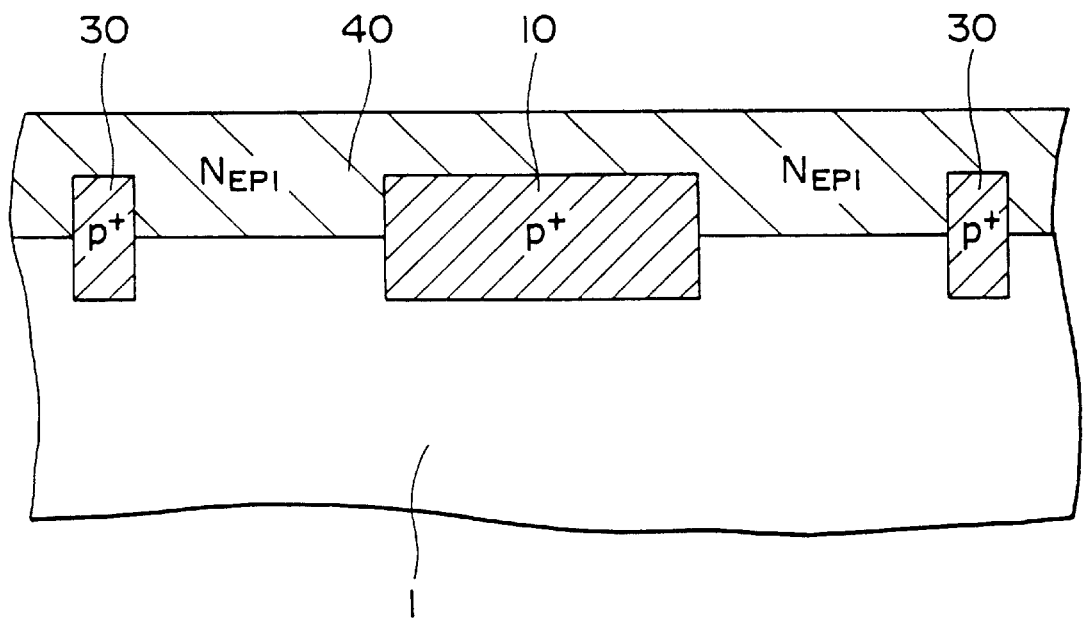

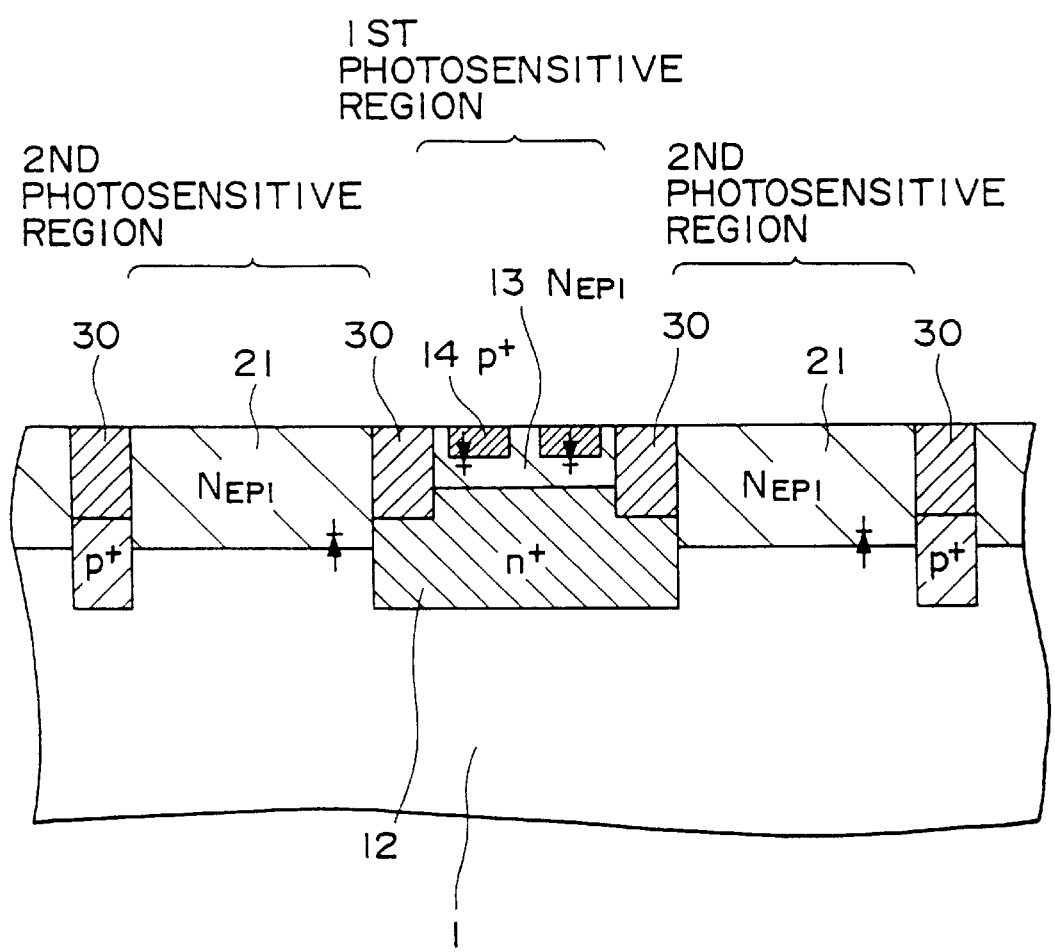

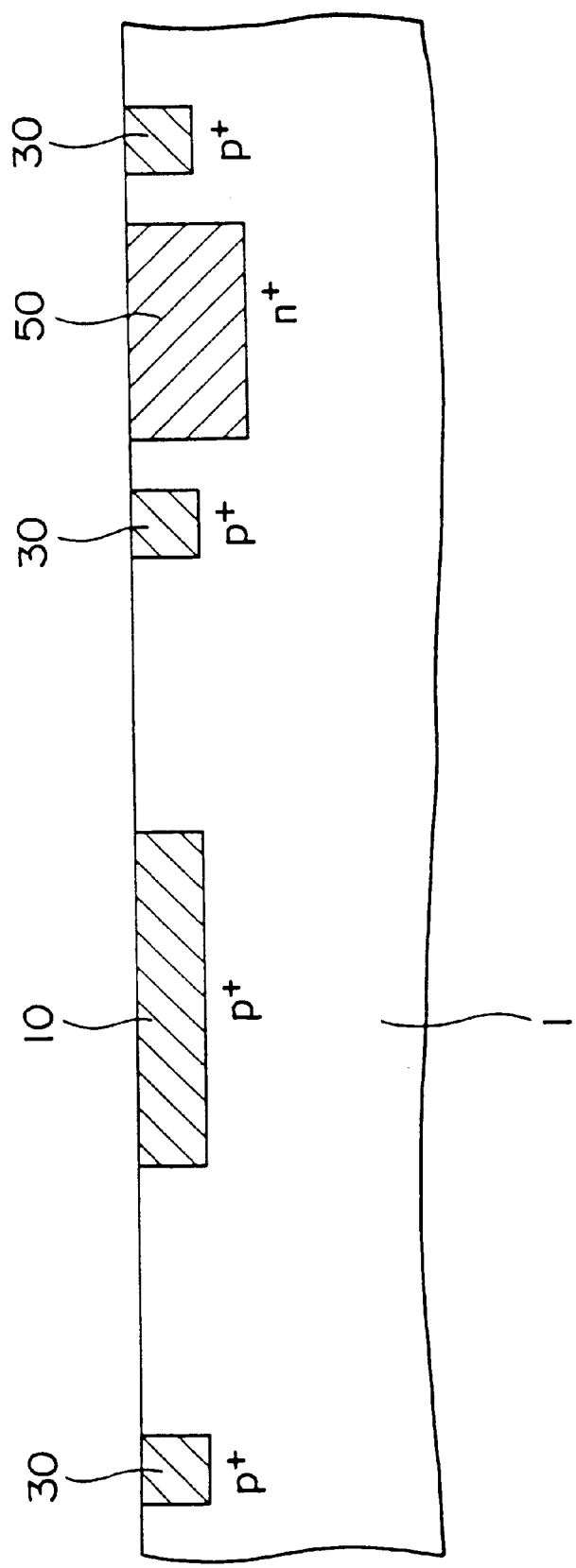

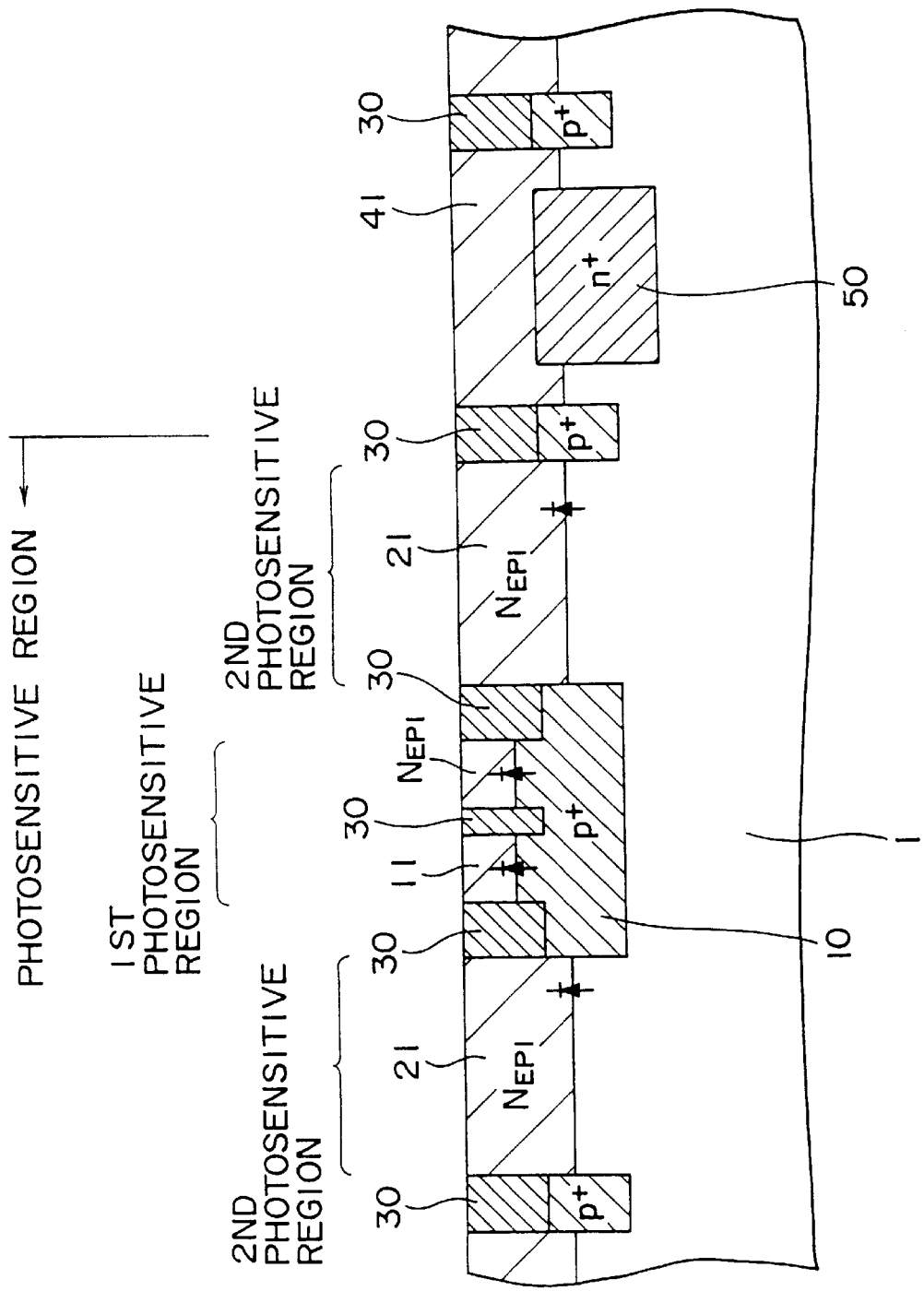

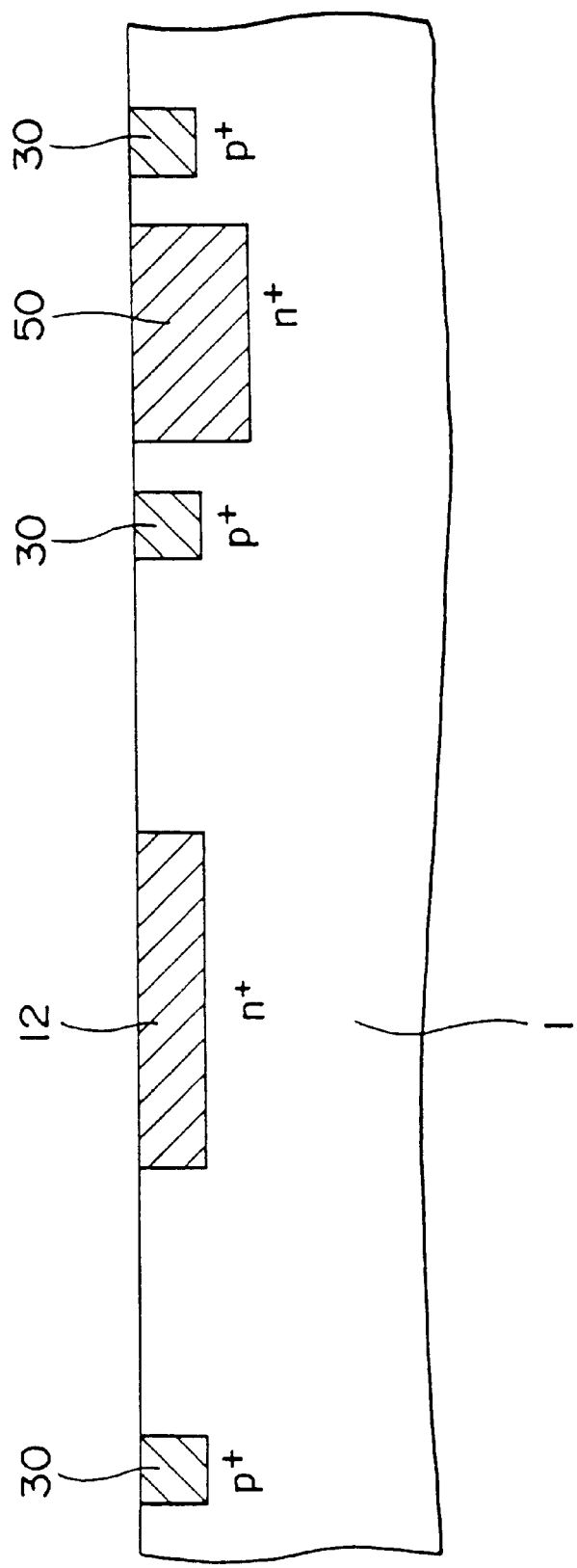

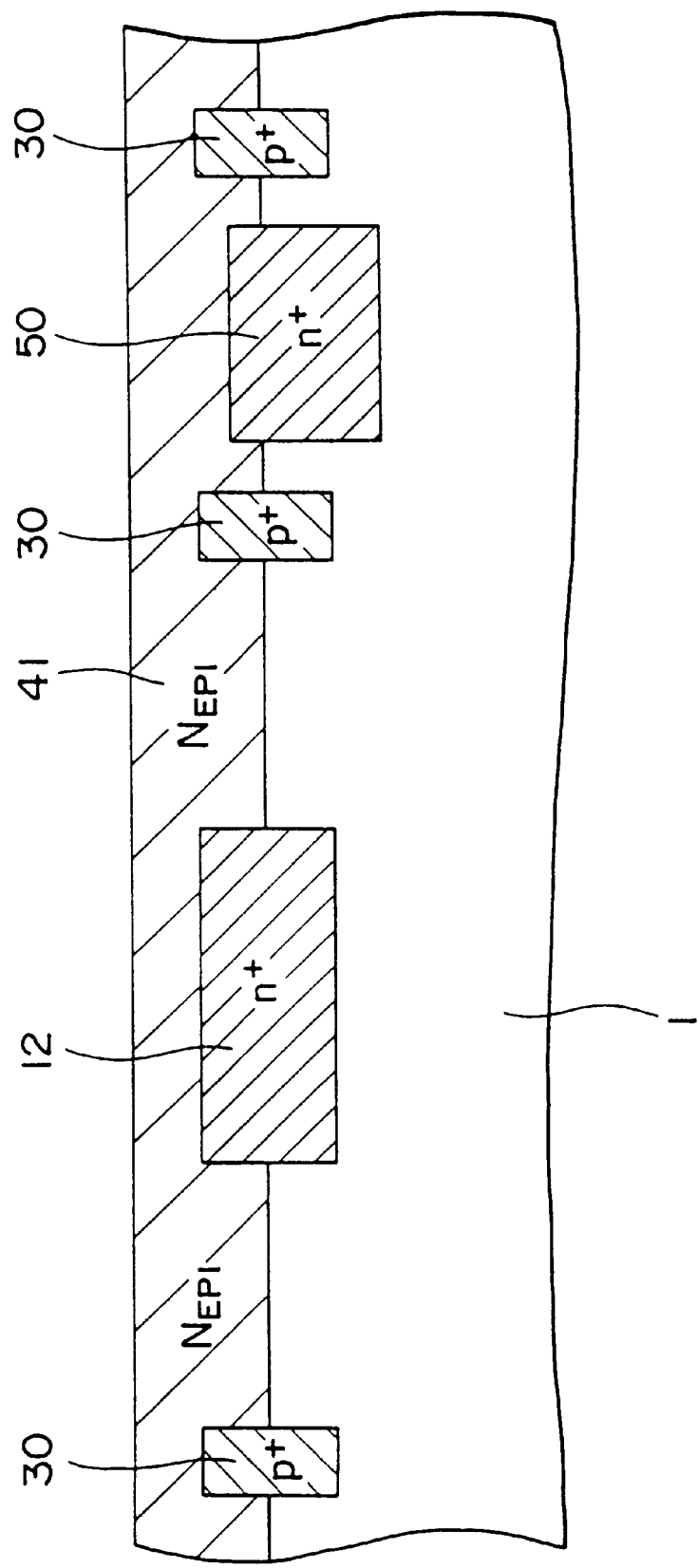

PHOTO SENSOR AND METHOD FOR FORMING THE SAME

This application is a continuation of application Ser. No. 08/489,875 filed Jun. 13, 1995. Now U.S. Pat. No. 5,898,209

BACKGROUND OF THE INVENTION

1. Field of the Invention

The present invention relates to a semiconductor photosensitive device and a semiconductor device which are optimum for application into an optical pickup, for example, of optical disc apparatus and a method for forming such devices.

2. Description of Related Art

A photo sensor is generally used for an optical pickup of an optical disc apparatus such as a compact disc apparatus and minidisc apparatus. Moreover, as the recent technology, a photosensitive element such as photodiode and a semiconductor element tend to be integrated into one chip. In the case of using a discrete photosensitive element, wirings are required for connecting the photosensitive element to a photodetecting circuit. However, such wirings are easily influenced by external disturbances from power supplies, electrical appliances such as television receivers, etc. Since a small current flows through the photosensitive element, a signal from the photosensitive element receives a large influence from external disturbances. Integration of the photosensitive element and semiconductor element into one chip enables reduction in size of an optical pickup and increases allowance for external noise disturbances.

A semiconductor photosensitive element to be used for an optical pickup of a compact disc apparatus (hereinafter, it is sometimes called a semiconductor photosensitive element for compact disc apparatus) is generally composed of six photosensitive regions A, B, C, D, E, and F as illustrated in the schematic layout of FIG. 1A. Four photosensitive regions A, B, C, and D are provided for detecting a focus error signal and a digital signal. Meanwhile, the photosensitive regions E and F are provided for detecting a tracking error signal. The characteristics required for the photosensitive regions A, B, C, and D and that required for the photosensitive regions E and F are different. That is, the excellent frequency characteristic is required for the photosensitive regions A, B, C, and D in order to detect digital signal. Meanwhile, such frequency characteristic is not so much important for the photosensitive regions E and F because these photosensitive regions detect the tracking error signal of comparatively low frequency. Instead, the excellent photoelectric conversion characteristic is required for the photosensitive regions E and F because these regions are irradiated with the light having comparatively low intensity.

A semiconductor photosensitive element used for optical pickup of a minidisc apparatus (hereinafter semiconductor photosensitive element for minidisc apparatus) is generally composed of eight photosensitive regions A, B, C, D, E, F, G, and H as illustrated in the schematic layout of FIG. 1B. Unlike the semiconductor photosensitive element used with compact disc arrangements, four photosensitive regions A, B, C, and D are provided in the semiconductor photosensitive element for minidisc apparatus for detecting a focus error signal. The photosensitive regions E and F are provided for detecting a tracking error signal. Moreover, the photosensitive regions G and H are provided for detecting a digital signal. Excellent photoelectric conversion characteristic is required for the photosensitive regions E and F because these regions are irradiated with the light beam having comparatively lower intensity. Meanwhile, excellent frequency characteristic is required for the photosensitive regions G and H to detect a digital signal. However, higher photoelectric conversion characteristic and frequency characteristic are not required for the photosensitive regions A, B, C, and D because these regions are radiated with the light beam having higher intensity and the focus error signal has comparatively lower frequency.

As explained above, different characteristics are required for respective photosensitive regions of the semiconductor photosensitive element used for optical pickup of optical disc apparatus. However, since the photoelectric conversion characteristic and frequency characteristic are in the trade-off relationship, when the photoelectric conversion characteristic, for example, is raised, the frequency characteristic is lowered. Therefore, a semiconductor photosensitive element, mainly having improved the photoelectric conversion characteristic, is used for optical pickup.

Furthermore, when a photosensitive element and a semiconductor element are integrated into one chip, a problem arises that such photosensitive element is limited in its characteristic in comparison with a discrete photosensitive element. Namely, since higher performance is required for the semiconductor element, a photosensitive element has to be formed almost without changing the manufacturing process of the conventional semiconductor integrated circuit. Therefore, it is difficult for a photosensitive element to give and improve the predetermined characteristic. In such a case, improvement in characteristics of a photosensitive element can be realized by adding intrinsic manufacturing processes for formation of the photosensitive element. But, such addition of manufacturing process results in an increase in manufacturing costs.

SUMMARY OF THE INVENTION

The first object of the present invention lies in providing a semiconductor photosensitive element which simultaneously satisfies the characteristics such as the photoelectric conversion characteristic and frequency characteristic in the trade-off relationship and in providing a method for forming the same element.

The second object of the present invention lies in providing a semiconductor device including a semiconductor photosensitive element which can easily integrate a photosensitive element and a semiconductor element almost without changing the manufacturing process of the conventional semiconductor integrated circuit and moreover simultaneously satisfies the characteristics such as photoelectric conversion characteristic and frequency characteristic in the trade-off relationship and also in providing a method for forming the same element.

The above-mentioned objects of the present invention may be attained by a semiconductor photosensitive element of the present invention, comprising first and second photosensitive regions, characterized in that the first photosensitive region has a structure different from that of the second photosensitive region and the first photosensitive region has different photoelectric conversion and frequency characteristics from that of the second photosensitive region.

According to the first profile of a semiconductor photosensitive element of the present invention, a first photosensitive region is composed of a high concentration impurity region of a first conductivity type formed on a semiconductor substrate of the first conductivity type and a photoelectric conversion layer of a second conductivity type is formed on such impurity region; a second photosensitive region is composed of a photoelectric conversion layer of a second conductivity type which is formed thicker than the photoelectric conversion layer forming the first photosensitive region on the semiconductor substrate; and an element isolation region is formed between these respective photosensitive regions.

In the first profile of a semiconductor photosensitive element of the present invention, it is preferable that thickness of the photoelectric conversion layer forming the first photosensitive region is set to 1 to 3 $\mu$m, and thickness of the photoelectric conversion layer forming the second photosensitive region is set to two to ten times that of the photoelectric conversion layer forming the first photosensitive region.

According to the second profile of a semiconductor photosensitive element of the present invention, a first photosensitive region is composed of a high concentration impurity region of the second conductivity type formed on the semiconductor substrate of the first conductivity type, a photoelectric conversion layer of the second conductivity type formed on such impurity region and a first conductivity type layer formed on the photoelectric conversion layer; a second photosensitive region is composed of a photoelectric conversion layer of the second conductivity type which is formed thicker than the photoelectric conversion layer forming the first photosensitive region on the semiconductor substrate; an element isolation region is formed between respective photosensitive regions.

In the second profile of a semiconductor photosensitive element of the present invention, it is preferable that thickness of the photoelectric conversion layer forming the first photosensitive region is set to 1 to 3 $\mu$m, and thickness of the photoelectric conversion layer forming the second photosensitive region is set to two to ten times that of the photoelectric conversion layer forming the first photosensitive region.

A semiconductor device attaining the objects explained above is composed of a semiconductor photosensitive element and a semiconductor element explained above. In this case, a semiconductor element may be a bipolar transistor which is formed on a high concentration impurity region of a second conductivity type formed on a semiconductor substrate of a first conductivity type.

A method for forming a semiconductor photosensitive element as a first profile of the present invention to attain the objects explained above comprises the steps of:

forming a high concentration impurity region of the first conductivity type and an element isolation region on a semiconductor substrate of the first conductivity type; and forming a semiconductor layer of the second conductivity type on the semiconductor substrate and the high concentration impurity region, thereby to form; (a) a first photosensitive region formed of the high concentration impurity region formed on the semiconductor substrate and a photoelectric conversion layer consisting of the semiconductor layer formed on such impurity region, and (b) a second photosensitive region formed of a photoelectric conversion layer consisting of the semiconductor layer formed on the semiconductor substrate.

A method for forming a semiconductor photosensitive element as a second profile of the present invention to attain the objects explained above comprises the steps of:

forming a high concentration impurity region of the second conductivity type and an element isolation region on a semiconductor substrate of the first conductivity type; and forming a first semiconductor layer of the second conductivity type on the semiconductor substrate and the high concentration impurity region and then forming a second semiconductor layer of the first conductivity type on the first semiconductor layer above the high concentration impurity region; thereby to form; (a) a first photosensitive region formed of the high concentration impurity region formed on the semiconductor substrate, a photoelectric conversion layer consisting of the first semiconductor layer formed on such impurity region and the second semiconductor layer formed on the photoelectric conversion layer; and (b) a second photosensitive region formed of the photoelectric conversion layer consisting of the first semiconductor layer formed on the semiconductor substrate.

A method for forming a semiconductor photosensitive element as a first profile of the present invention to attain the objects explained above comprises the steps of:

forming a first high concentration impurity region of the first conductivity type and an element isolation region on a semiconductor substrate of the first conductivity type and forming also a second high concentration impurity region of the second conductivity type;

forming a semiconductor layer of the second conductivity type on the semiconductor substrate and first and second high concentration impurity regions, thereby to form; (a) a first photosensitive region formed of a first high concentration impurity region formed on the semiconductor substrate and the photoelectric conversion layer consisting of the semiconductor layer formed on such impurity region; and (b) a second photosensitive region formed of the photoelectric conversion layer consisting of the semiconductor layer formed on the semiconductor substrate; and forming a semiconductor element to the semiconductor layer on the second high concentration impurity region.

A method for forming a semiconductor photosensitive element as a second profile of the present invention to attain the objects explained above comprises the steps of:

forming a first high concentration impurity region and a second high concentration impurity region of the second conductivity type and an element isolation region of the first conductivity type on a semiconductor substrate of the first conductivity type;

forming a first semiconductor layer of the second conductivity type on the semiconductor substrate and first and second high concentration impurity regions; thereby to form; (a) a second photosensitive region formed of the photoelectric conversion layer consisting of the first semiconductor layer formed on the semiconductor substrate;

forming a semiconductor element on the first semiconductor layer above the second high concentration impurity region and then forming a second semiconductor layer of the first conductivity type on the first semiconductor layer above the first high concentration impurity region; thereby to form (b) a first photosensitive region formed of the first high concentration impurity region formed on the semiconductor substrate, the photoelectric conversion layer consisting of the first semiconductor layer formed on such impurity region and the second semiconductor layer formed on the photoelectric conversion layer.

In the method for forming a semiconductor device of the first and second profiles of the present invention, a semiconductor element may be formed of a bipolar transistor.

In the present invention, a silicon semiconductor substrate or a gallium arsenic compound semiconductor substrate may be used as a semiconductor substrate. Moreover, a photoelectric conversion layer (or a semiconductor layer or a first semiconductor layer forming such photoelectric conversion layer) is preferably formed of a single crystal silicon in such a case that the semiconductor substrate is composed of a silicon semiconductor substrate. In addition, it is preferably formed of a gallium arsenic compound single crystal in such a case that the semiconductor substrate is composed of a gallium arsenic compound semiconductor substrate.

In the method of manufacturing a semiconductor photosensitive element or the method of manufacturing a semiconductor device of the present invention, the high concentration impurity region and element isolation region may be formed, for example, by diffusion or ion implantation of impurity. A semiconductor layer or a first semiconductor layer may be formed, for example, through epitaxial growth by the CVD method. Moreover, a second semiconductor layer may be formed, for example, by diffusion or ion implantation of impurity.

A semiconductor photosensitive element or a semiconductor device in the present invention is provided with a first photosensitive region and a second photosensitive region. The first photosensitive region is formed of a high concentration impurity region and a photoelectric conversion layer formed thereon. Thickness of the photoelectric conversion layer forming the first photosensitive region is set thinner than that of the photoelectric conversion layer forming the second photosensitive region. For example, when a first conductivity type is defined as p type and a second conductivity type as n type, electrons generated in the photoelectric conversion layer of the first photosensitive region move at a high speed in the direction opposed to the semiconductor substrate within the photoelectric conversion layer in the condition of a depletion layer. Moreover, electrons generated in the high concentration impurity region are immediately recombined. Therefore, the first photosensitive region has a low photoelectric conversion characteristic because of the small amount of electrons which will become a photo current, but has, on the contrary, the excellent frequency characteristic because of higher speed of electrons.

Meanwhile, the second photosensitive region is formed of the photoelectric conversion layer formed on the semiconductor substrate. The photoelectric conversion layer forming the second photosensitive region is set thicker than the photoelectric conversion layer forming the first photosensitive region. For example, a first conductivity type is defined as p type and a second conductivity type as n type, electrons generated in the photoelectric conversion layer of the second photosensitive region move at a high speed in the direction opposed to the semiconductor substrate within the photoelectric conversion layer in the condition of a depletion layer. Moreover, electrons generated in the semiconductor substrate having a low impurity concentration move within the semiconductor substrate while these are diffused therein. Therefore, the second photosensitive region has a higher photoelectric conversion characteristic because of the large amount of electrons which will become a photo current but has, on the contrary, a lower frequency characteristic because of lower speed of electrons moving within the semiconductor substrate.

As explained above, different photoelectric conversion characteristics and frequency characteristics can be given to respective photosensitive regions by forming the first and second photosensitive regions in different structures.

In the first profile of a semiconductor photosensitive element of the present invention, the method for forming a semiconductor photosensitive element depending on the first profile and the method for forming a semiconductor device depending on the first profile, a so-called common anode terminal type (common cathode terminal type depending on the conductivity type) photosensitive element can be formed for both first and second photosensitive regions. On the other hand, in the second profile of a semiconductor photosensitive element of the present invention, the method for forming a semiconductor photosensitive element depending on the second profile and the method for forming a semiconductor device of the second profile, a so-called common cathode terminal type (common anode terminal type depending on the conductivity type) photosensitive element can be formed for the first photosensitive region, while a common anode terminal type (common cathode terminal type depending on the conductivity type) can be formed for the second photosensitive region. That is, polarity of the signal outputted from the first photosensitive region may be inverted. Therefore, a degree of freedom for selection of an amplifier for amplifying the signal outputted from the first photosensitive region and a signal processing circuit can be widened or an inverter for inverting polarity of signal can be ruled out.

In the method for forming a semiconductor photosensitive element or semiconductor device of the present invention, the first photosensitive region having excellent frequency characteristic and the second photosensitive region having excellent photoelectric conversion characteristic can be formed simultaneously only by minimal changes to the conventional manufacturing process of the bipolar transistor.

BRIEF DESCRIPTION OF THE DRAWINGS

FIGS. 3A and 3B are schematic partial cross-sectional views of a semiconductor substrate for explaining the manufacturing steps of the semiconductor photosensitive element of the second embodiment of the present invention.

FIG. 4 is a schematic partial cross-sectional view of the semiconductor photosensitive element of the third embodiment of the present invention.

FIGS. 7A to 7C are schematic partial cross-sectional views of a semiconductor substrate for explaining the manufacturing steps of the semiconductor device of the sixth embodiment of the present invention.

FIGS. 9A to 9D are schematic partial cross-sectional views of a semiconductor substrate for explaining the manufacturing steps of the semiconductor device of the eighth embodiment of the present invention.

DETAILED DESCRIPTION OF THE PREFERRED EMBODIMENTS

The present invention will then be explained on the basis of the preferred embodiments with reference to the accompanying drawings. The embodiment 1 relates to a semiconductor photosensitive element and a method for forming the same depending on the first profile of the present invention. The embodiment 2 relates to a semiconductor photosensitive element and a method for forming the same depending on the second profile of the present invention. The embodiment 3 relates to a semiconductor device including a semiconductor photosensitive element and a method for forming the same depending on the first profile of the present invention. The embodiment 4 relates to a semiconductor device including a semiconductor photosensitive element and a method for forming the same depending on the second profile of the present invention. In the embodiments described hereunder, the p type conductivity is selected as the first conductivity type and the n type conductivity as the second conductivity type.

The semiconductor photosensitive element of the present invention has first and second photosensitive regions. The first photosensitive region has a structure different from the second photosensitive region and thereby has a different photoelectric conversion characteristic as well as a different frequency characteristic from those of the second photosensitive region. In more practical, terms the first photosensitive region has a better frequency characteristic in comparison with the second photosensitive region. Meanwhile, the second photosensitive region has a better photoelectric conversion characteristic in comparison with the first photosensitive region.

Figure 2:
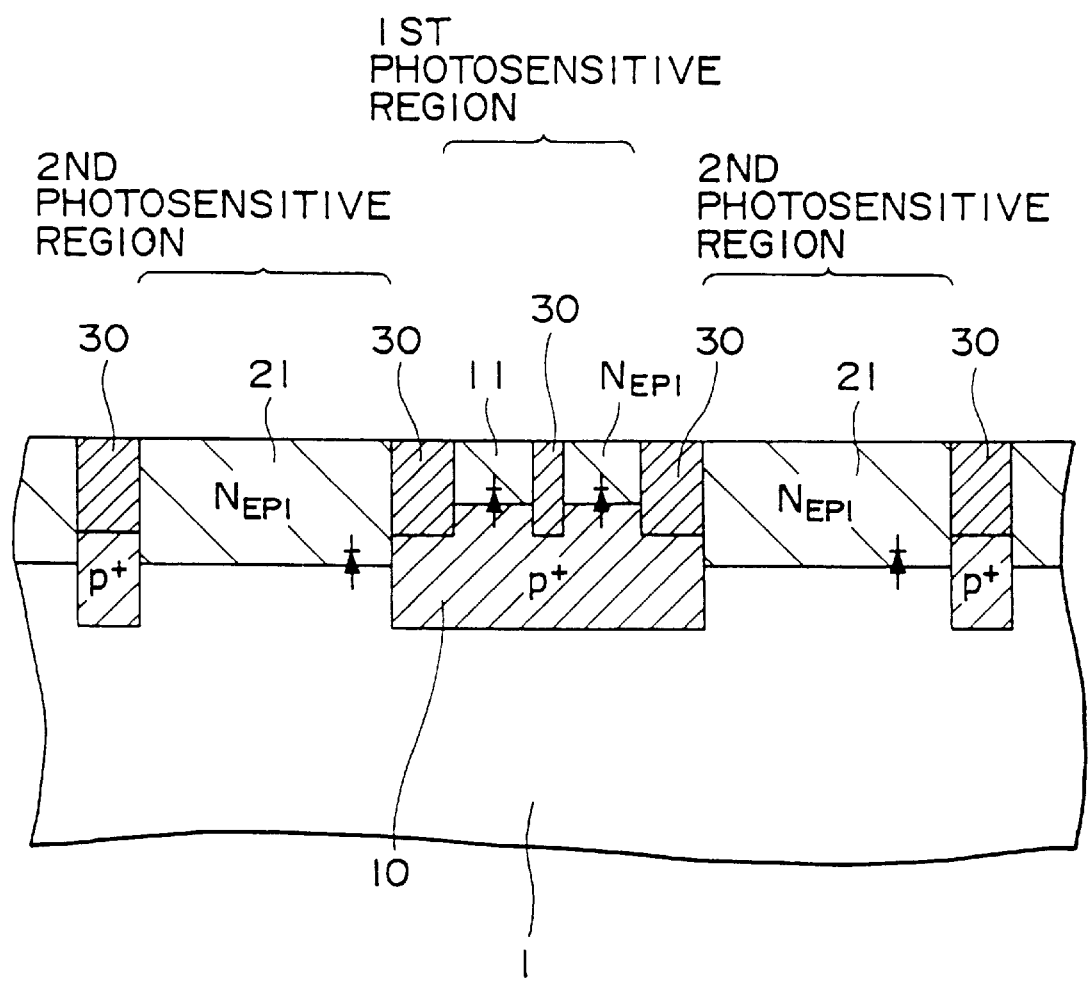
FIG. 2 is a schematic partial cross-sectional view of the semiconductor photosensitive element of the first embodiment of the present invention.

The embodiment 1 relates to a semiconductor photosensitive element and a method for forming the same depending on the first profile of the present invention. A schematic partial cross-sectional view of a semiconductor photosensitive element of the embodiment 1 is shown in FIG. 2. The first photosensitive region is composed of a high concentration impurity region 10 of a first conductivity type (p+type) formed on a semiconductor substrate 1 of the first conductivity type (p type) and a photoelectric conversion layer 11 of a second conductivity type (n type) formed on the high concentration impurity region 10. Meanwhile, the second photosensitive region is formed of a photoelectric conversion layer 21 of the second conductivity type (n type) which is formed, on the semiconductor substrate 1, thicker than the photoelectric conversion layer 11 forming the first photosensitive region. The photosensitive regions are isolated by an element isolation region 30 formed therebetween. In FIG. 2, a couple of the first photosensitive regions and a couple of the second photosensitive regions are illustrated.

Thickness of the photoelectric conversion layer 11 forming the first photosensitive region is set, for example, to 2 $\mu$m, while thickness of the photoelectric conversion layer 21 forming the second photosensitive region is set, for example, to 4 $\mu$m. Moreover, an impurity concentration of the semiconductor substrate 1 is set to $3 \times 10^{15}/cm^3$, while an impurity concentration of the high concentration impurity region 10 to $5 \times 10^{18}/cm^3$ and an impurity concentration of the photoelectric conversion layers 11 and 21 to $5 \times 10^{15}/cm^3$. Thereby, it has been confirmed that the first photosensitive region operates with the frequency up to 30 MHz. However, the photoelectric conversion characteristic of the first photosensitive region has been 0.2 A/W. Meanwhile, the photoelectric conversion characteristic of the second photosensitive region was 0.4 A/W. However, it has also been confirmed that the second photosensitive region operates only with the frequency under 3 MHz.

Figure 1A:
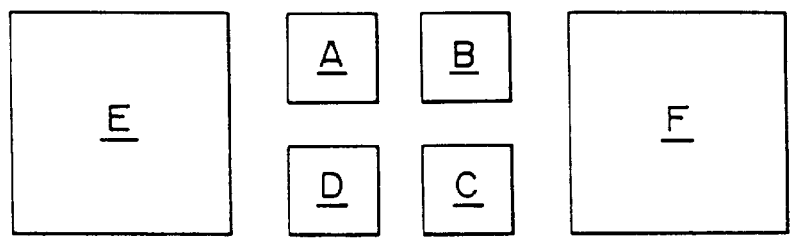
FIGS. 1A and 1B are schematic diagrams illustrating the layout of a semiconductor photosensitive element of the related art used in an optical pickup of a compact disc apparatus and minidisc apparatus.
Figure 1B:
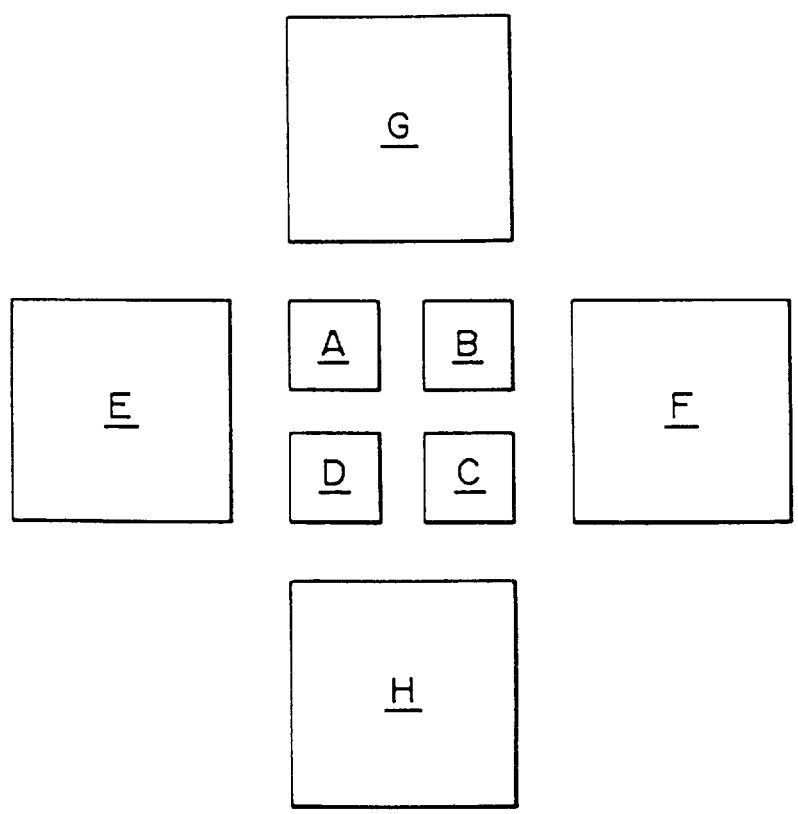

In regard to the six photosensitive regions A, B, C, D, E, and F of the semiconductor photosensitive element for compact disc apparatus shown in FIG. 1A, four photosensitive regions A, B, C, and D correspond to the first photosensitive region. Meanwhile, the photosensitive regions E and F correspond to the second photosensitive region. In regard to eight photosensitive regions A, B, C, D, E, F, G, and H of the semiconductor photosensitive element for minidisc apparatus, the photosensitive regions G and H correspond to the first photosensitive region, while the photosensitive regions E and F correspond to the second photosensitive region. The photosensitive regions A, B, C and D are irradiated with an intensive light beam and the focus error signal has a comparatively lower frequency. Therefore, higher photoelectric conversion characteristic and frequency characteristic are not required for such photosensitive regions. Accordingly, the photosensitive regions A, B, C, and D may have the structure of the first photosensitive region or the second photosensitive region.

The embodiment 2 of the present invention disclosing a method for forming a semiconductor photosensitive element as the embodiment 1 will be explained with reference to a schematic partial cross-sectional view of a semiconductor substrate shown in FIGS. 3A and 3B.

First, a high concentration impurity region 10 of the first conductivity type (p+type) and an element isolation region 30 are to be formed on a silicon semiconductor substrate 1 of the first conductivity type (p type) (refer to FIG. 3A). For this purpose, a mask, provided with an aperture (not illustrated) in the region where the high concentration impurity region 10 and element isolation region 30 are to be formed, is formed on the surface of the semiconductor substrate 1. Thereafter, a high concentration p type impurity (for example, boron) is diffused or ion implanted to the semiconductor substrate 1 to form the high concentration impurity region 10 of the first conductivity type (p+type) and the element isolation region 30. This high concentration impurity region 10 is a buried type.

Thereafter, a semiconductor layer 40 of the second conductivity type (n type) is formed (refer to FIG. 3B), for example, by the CVD method on the semiconductor substrate 1 including the element isolation region 30 and the high concentration impurity region 10. The semiconductor layer 40 is composed of an n-type single crystal silicon epitaxially grown by the CVD method. In the CVD method, the $SiH_4/H_2$ gas is used, for example, as the raw gas, while $AsH_3$ gas as the doping gas. The semiconductor layer 40 is formed on the semiconductor substrate 1 in the thickness of 4 $\mu$m. While the semiconductor layer 40 is epitaxially grown, a part of the semiconductor layer 40 above the high concentration impurity region 10 and the element isolation region 30 comes to have the first conductivity type (p+type) due to outer diffusion and auto-doping of the p type impurity. As a result, the semiconductor layer 40 of the second conductivity type (n type) above the high concentration impurity region 10 and the element isolation region 30 is reduced in thickness to about 2 $\mu$m.

Thereafter, in order to complete the element isolation region 30, a mask (not illustrated) is provided on the semiconductor layer 40 above the element isolation region 30 and then boron is ion-implanted thereto. As explained above, a first photosensitive region formed of the photoelectric conversion region 11 composed of the high concentration impurity region 10 formed on the semiconductor substrate 1 and the semiconductor layer 40 formed on the impurity region 10 and a second photosensitive region formed of the photoelectric conversion layer 21 composed of the semiconductor layer 40 formed on the semiconductor substrate 1 are formed (refer to FIG. 2). Thereafter, an anode terminal and a cathode terminal (not illustrated) are formed with aluminum or aluminum alloy to each photosensitive region by the known method and the surface of each photosensitive region is covered with a covering material (not illustrated) for the protection purpose.

The embodiment 3 relates to a semiconductor photosensitive element depending on the second profile of the present invention and a method for forming the same. A schematic partial cross-sectional view of a semiconductor photosensitive element of the embodiment 3 is shown in FIG. 4. The first photosensitive region is composed of a high concentration impurity region 12 of the second conductivity type ($n^+$ type) formed on a semiconductor substrate 1 of the first conductivity type (p type), a photoelectric conversion layer 13 of the second conductivity type (n type) formed on the high concentration impurity region 12 and a first conductivity type layer ($p^+$ type layer) 14 formed the photoelectric conversion layer 13. Meanwhile, the second photosensitive region is formed of a photoelectric conversion layer 21 of the second conductivity type (n type) formed, on the semiconductor substrate 1, thicker than the photoelectric conversion layer 13 forming the first photosensitive region. Moreover, the photosensitive regions are isolated by an element isolation region 30. FIG. 4 illustrates a couple of the first photosensitive regions and a couple of the second photosensitive regions.

The photoelectric conversion layer 13 forming the first photosensitive region is formed, for example, in the thickness of 2 $\mu$m, while the photoelectric conversion layer 21 forming the second photosensitive region is formed, for example, in the thickness of 4 $\mu$m. Moreover, the semiconductor substrate 1 is given the impurity concentration of $3 \times 10^{15}/cm^3$, while the high concentration impurity region 10 is given the impurity concentration of $5 \times 10^{18}/cm^3$ and the photoelectric conversion layers 13 and 14 are given the impurity concentration of $7 \times 10^{17}/cm^3$, respectively.

The embodiment 4 of the present invention disclosing a method for forming a semiconductor photosensitive element as the embodiment 3 will be explained with reference to a schematic partial cross-sectional view of the semiconductor substrate shown in FIGS. 5A to 5C.

Figure 5A:
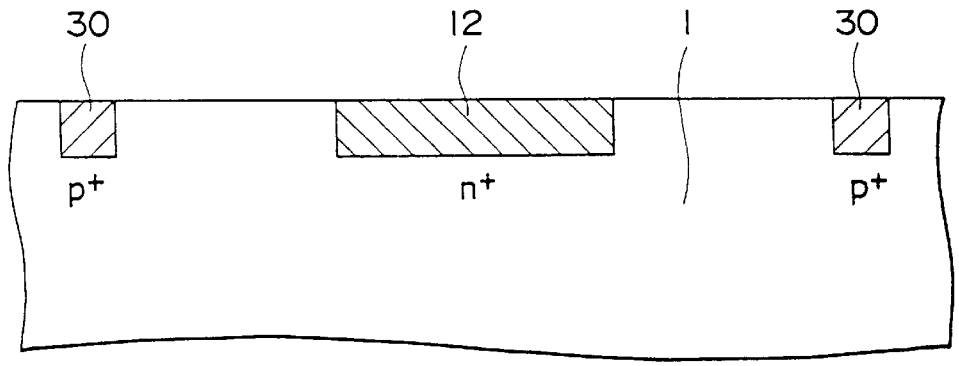
FIGS. 5A to 5C are schematic partial cross-sectional views of a semiconductor substrate for explaining the manufacturing steps of the semiconductor photosensitive element of the fourth embodiment of the present, invention.
Figure 5B:
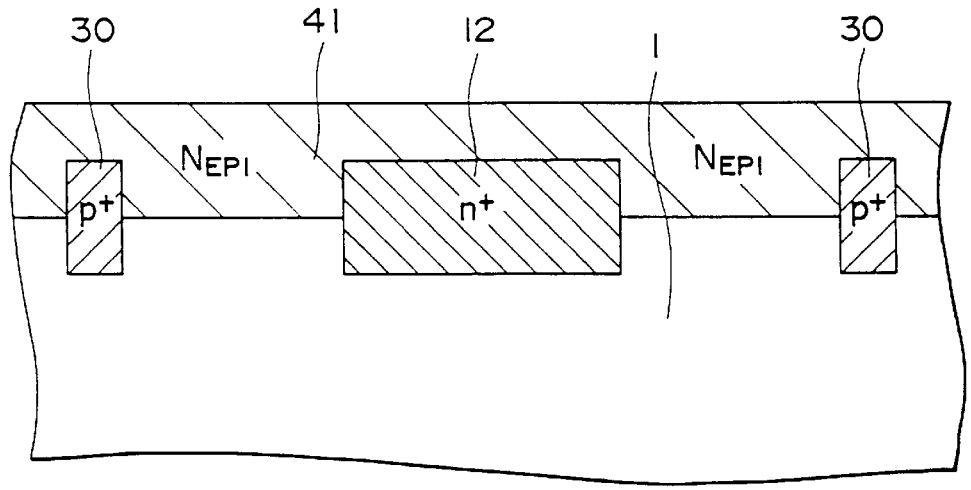

First, a high concentration impurity region 12 of the second conductivity type ($n^+$ type) and an element isolation region 30 of the first conductivity type ($p^+$ type) are to be formed on a silicon semiconductor substrate 1 of the first conductivity type (p type) (refer to FIG. 5A). For this purpose, a mask provided with an aperture in the region where the high concentration impurity region 12 is to be formed (not illustrated) is formed on the surface of the semiconductor substrate 1. Thereafter, a high concentration n type impurity (for example, arsenic) is diffused or ion-implanted to the semiconductor substrate 1 to form the high concentration impurity region 12 of the second conductivity type ($n^+$ type). Next, a mask provided with an aperture in the region where the element isolation region 30 is to be formed (not illustrated) is formed on the surface of the semiconductor substrate 1. Thereafter, a high concentration p type impurity (for example, boron) is diffused or ion-implanted to the semiconductor substrate 1 to form an element isolation region 30 of the first conductivity type ($p^+$ type). Here, the formation sequence of the high concentration impurity region 12 and element isolation region 30 may be inverted. This high concentration impurity region 12 is of the buried type.

Subsequently, a first semiconductor layer 41 of the second conductivity type (n type) is formed, for example, by the CVD method on the semiconductor substrate 1 including the element isolation region 30 and the high concentration impurity region 12 (refer to FIG. 5B). The first semiconductor layer 41 is formed of an n type single crystal silicon epitaxially grown by the CVD method. In the CVD method, $SiH_4/H_2$ gas, for example, is used as the raw gas, while the $AsH_3$ gas as the doping gas. The first semiconductor layer 41 is formed on the semiconductor substrate 1 in the thickness of 4 $\mu$m. While the first semiconductor layer 41 is epitaxially grown, a part of the first semiconductor layer 41 above the high concentration impurity region 12 and element isolation region 30 comes to have the second conductivity type ($n^+$ type) and the first conductivity type ($p^+$ type) due to the outer diffusion and auto-doping of the p type impurity. As a result, the first semiconductor layer 41 of the second conductivity type (n type) above the high concentration impurity region 12 and element isolation region 30 is reduced in the thickness to about 2 $\mu$m.

Figure 5C:
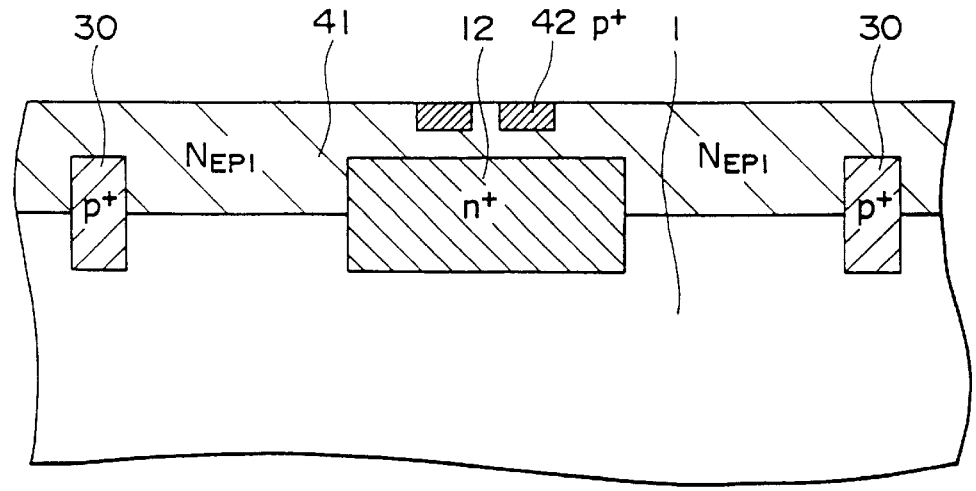

Next, a second semiconductor layer 42 of the first conductivity type ($p^+$ type) is formed on the first semiconductor layer 41 above the high concentration impurity region 12 (refer to FIG. 5C). The second semiconductor layer 42 may be formed by diffusion or ion-implantation of the p type impurity (for example, boron) into the first semiconductor layer 41.

Figure 6:
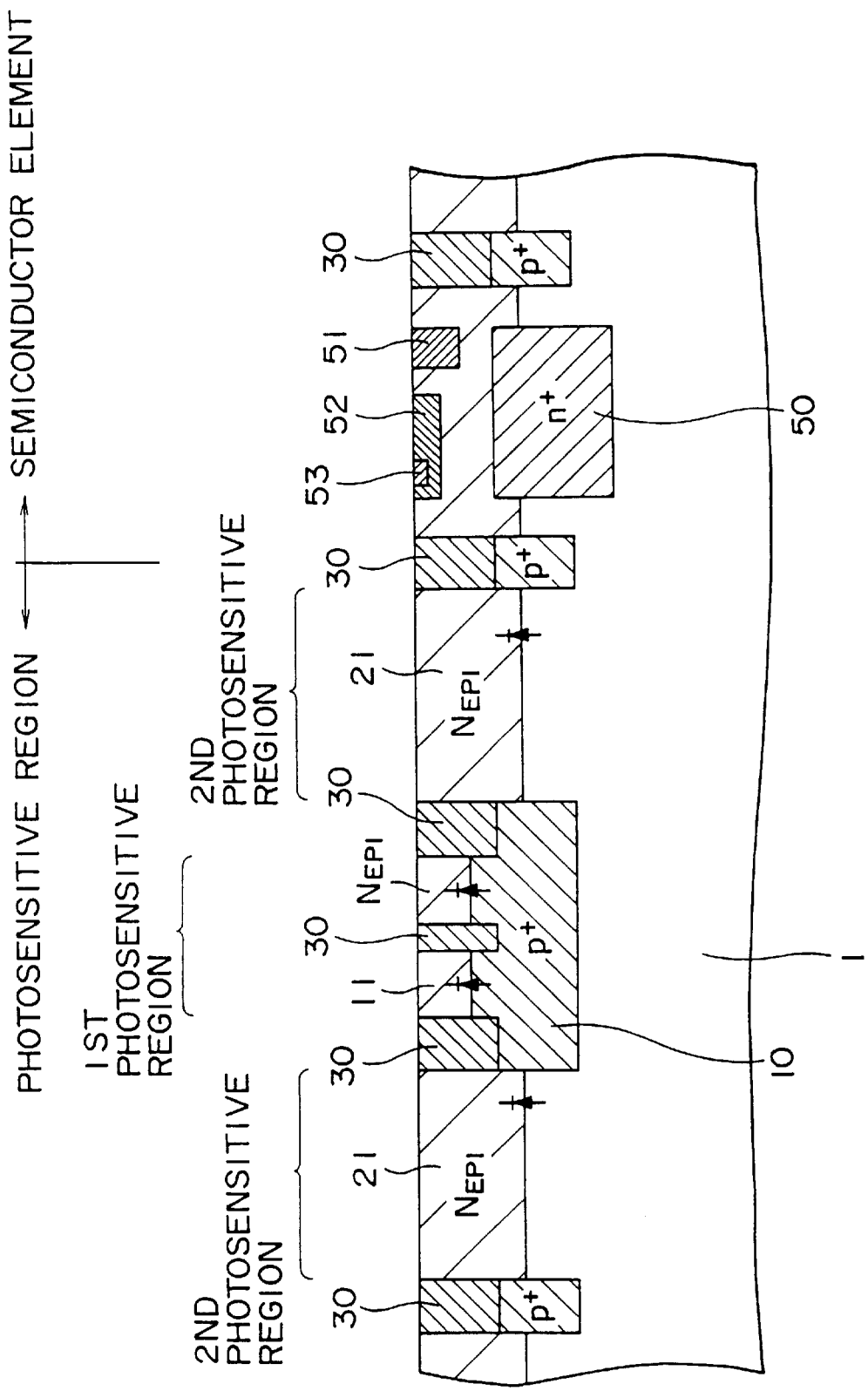
FIG. 6 is a schematic partial cross-sectional view of the semiconductor device of the fifth embodiment of the present invention.

Thereafter, in order to complete the element isolation region 30, a mask (not illustrated) is provided on the first semiconductor layer 41 above the element isolation region 30 and boron is ion-implanted to the mask. Thereby, the first photosensitive region is formed of the high concentration impurity region 12 formed on the semiconductor substrate 1, the photoelectric conversion layer 13 composed of first semiconductor layer 41 formed on the impurity region and the second semiconductor layer 42 (first conductivity type layer 14) formed on the photoelectric conversion layer 13. In addition, the second photosensitive region formed of the photoelectric conversion layer 21 composed of the first semiconductor layer 41 formed on the semiconductor substrate 1 is also formed (refer to FIG. 3). An anode terminal and a cathode terminal (not illustrated) are formed to each photosensitive region with aluminum or aluminum alloy by the known method to cover the surface of each photosensitive region with a covering material (not illustrated) for the protection purpose. Here, the ion-implantation for completing the element isolation region 30 may be executed before the The embodiment 5 relates to a semiconductor device depending on the first profile of the present invention and a method for forming the same. The schematic partial cross-sectional view of the semiconductor device of the embodiment 5 is shown in FIG. 6. The structures of the first and second photosensitive regions are the same as the structure of each photosensitive region explained with respect to the embodiment 1 and detail explanation about the structures is omitted here. The semiconductor device of the embodiment 5 is defined as a bipolar transistor, in more practical terms, a vertical npn type bipolar transistor formed on the high concentration impurity region 50 of the second conductivity type ($n^+$ type) formed on the semiconductor substrate 1 of the first conductivity type (p type).

A method for forming the semiconductor device of the embodiment 5 is substantially the same as a method for forming the semiconductor photosensitive element explained as the embodiment 1, except for the point that the manufacturing step of the semiconductor element is included. A method for forming the semiconductor device of the embodiment 5 will be explained with reference to FIGS. 7A to 7C.

First, a high concentration impurity region 10 of the first conductivity type (n⁺ type) and an element isolation region 30 are to be formed on a silicon semiconductor substrate 1 of the first conductivity type (p type). For this purpose, a mask provided with an aperture in the region where the high concentration impurity region 10 and element isolation region 30 are to be formed (not illustrated) is formed on the surface of the semiconductor substrate 1. A high concentration p type impurity (for example, boron) is diffused or ion-implanted to the semiconductor substrate 1 to form the high concentration impurity region 12 of the first conductivity type (p⁺ type) and the element isolation region 30. Next, a mask provided with an aperture in the region where a second high concentration impurity region 50 is to be formed (not illustrated) is formed on the surface of the semiconductor substrate 1. A high concentration n type impurity (for example, arsenic) is then diffused or ion-implanted to the semiconductor substrate 1 to form the second high concentration impurity region 50 of the second conductivity type (n⁺ type) (refer to FIG. 7A). Formation of the first high concentration impurity region 10 of the first conductivity type and element isolation region 30 and formation of the second high concentration impurity region 50 of the second conductivity type may be executed in the inverted sequence. These high concentration impurity regions 10 and 50 are of the buried type. The second high concentration impurity region 50 provides a low resistance path extending to the collector from an active region of a bipolar transistor as the semiconductor element to be formed rater.

Figure 7B:
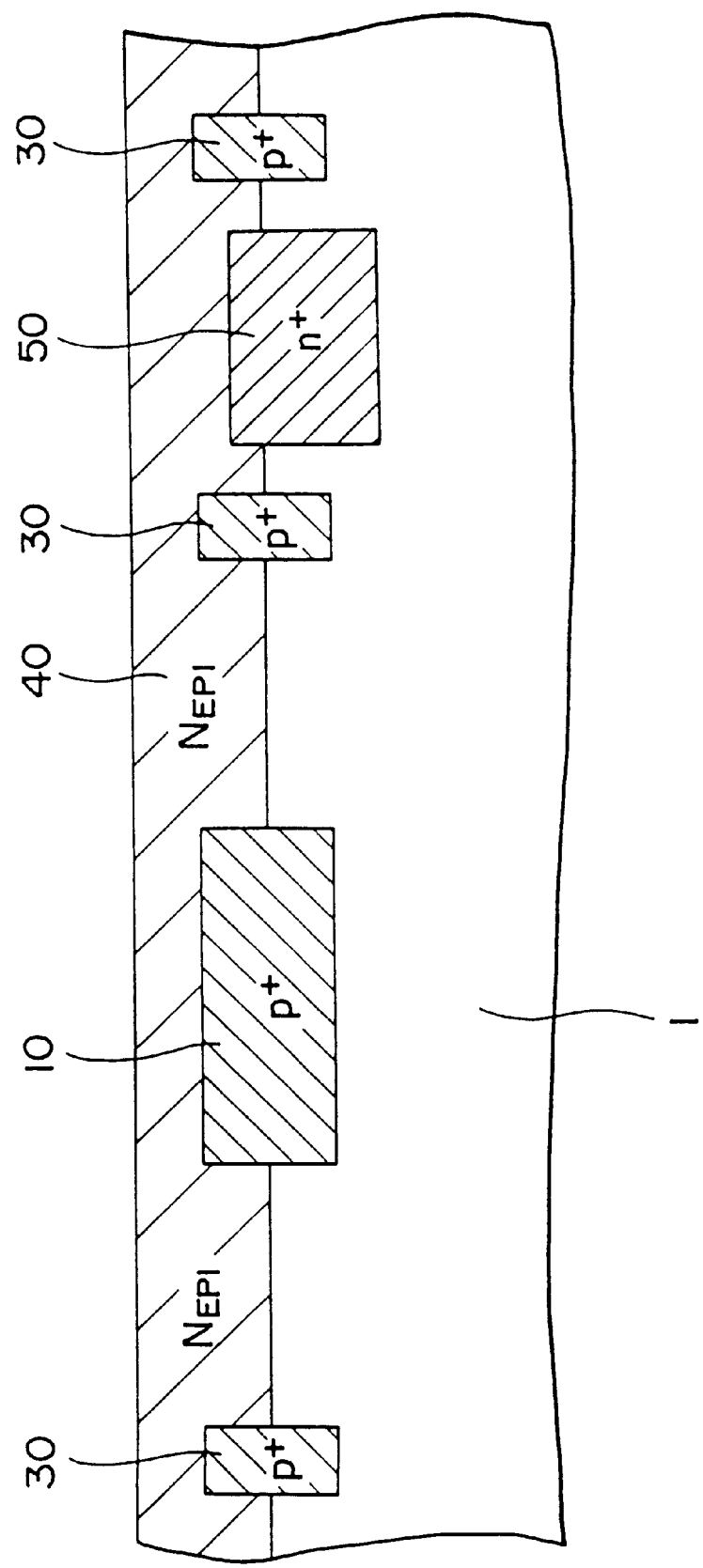

Next, a semiconductor layer 40 of the second conductivity type (n type) is formed on the semiconductor substrate 1 including the element isolation region 30 and the first and second high concentration impurity regions 10 and 50 (refer to FIG. 7B). This step may be executed in the same manner as the disclosed in relation to embodiment 1.

Thereafter, in order to complete the element isolation layer 30, a mask (not illustrated) is provided on the semiconductor layer 40 above the element isolation region 30 and boron is ion-implanted to the mask. Thereby, the first photosensitive region, formed of the photoelectric conversion layer 11 composed of the first high concentration impurity region 10 formed on the semiconductor substrate 1 and the semiconductor layer 40 formed on the first high concentration impurity region 10, may be formed. In addition, the second photosensitive region formed of the photoelectric conversion layer 21 consisting of the semiconductor layer 40 formed on the semiconductor substrate 1 may also be formed (refer to FIG. 7C).

Next, with the method of the related arts, a semiconductor element consisting of a vertical type npn bipolar transistor is to be formed on the semiconductor layer 40 on the second high concentration impurity region 50. For this purpose, a base 52 consisting of the p type conductive region is formed by diffusion or ion-implantation of the p type impurity (for example, boron) into the semiconductor layer 40. Formation of the base 52 may be done simultaneously by ion-implantation of boron to complete the element isolation region 30 (refer to FIG. 7C). Next, a collector 51 and an emitter 53 consisting of the n⁺ type conductive region are formed by diffusion or ion-implantation of the n type impurity (for example, arsenic) into the semiconductor layer 40 and a part of the base 52. As explained above, the semiconductor device shown in FIG. 6 can be manufactured.

Thereafter, an anode terminal and a cathode terminal (not illustrated) are formed with aluminum or aluminum alloy by the known method to each photosensitive region and the surface of each photosensitive region is covered with a covering material (not illustrated) for the protection purpose. Meanwhile, electrodes are formed to the collector 51, base 52 and emitter 53 of the semiconductor element and the semiconductor element and each photosensitive region are electrically connected, as required, with a wiring composed of a metal wiring material.

Figure 8:
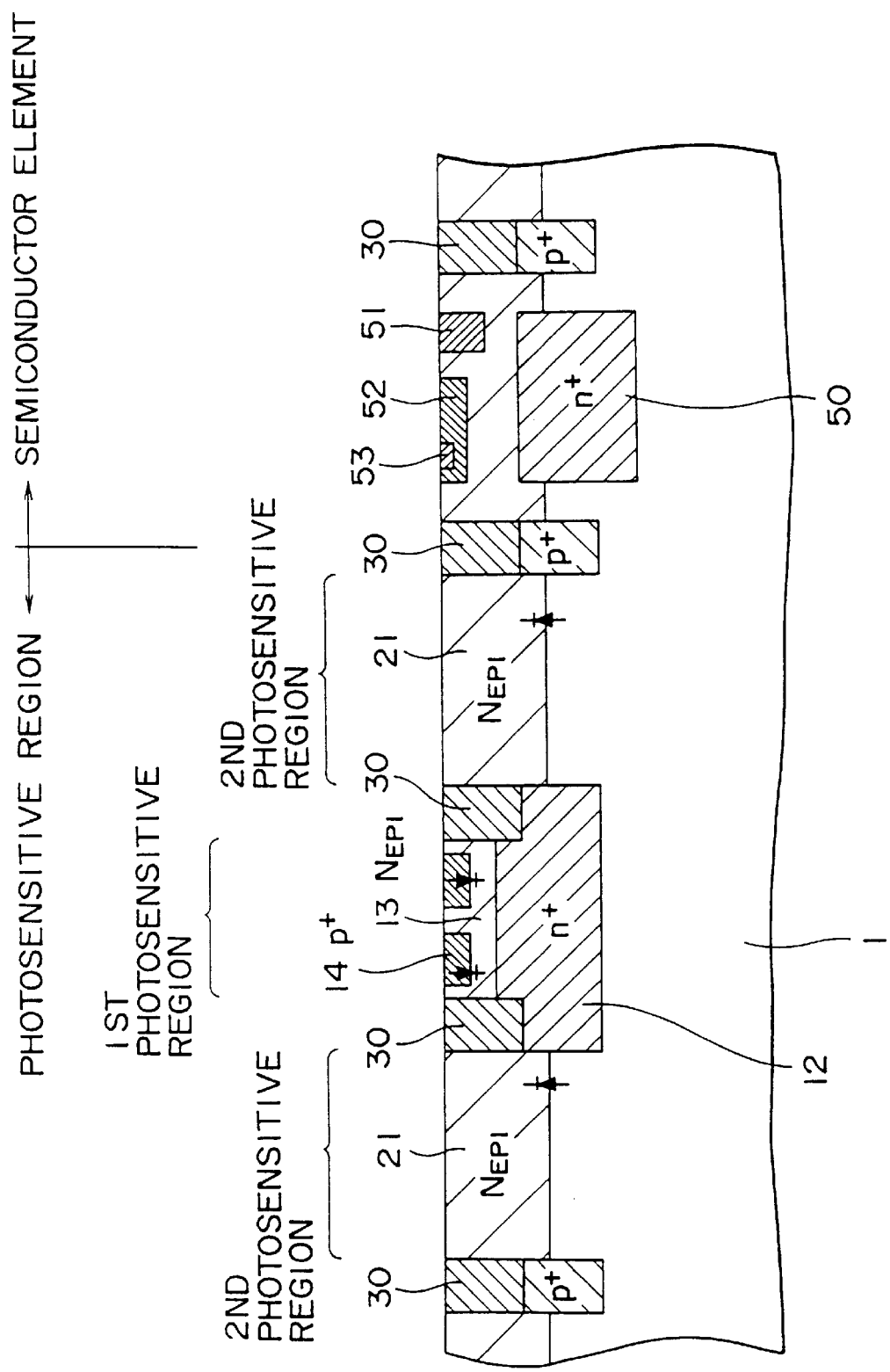
FIG. 8 is a schematic partial cross-sectional view of the semiconductor device of the seventh embodiment of the present invention.
Figure 9C:
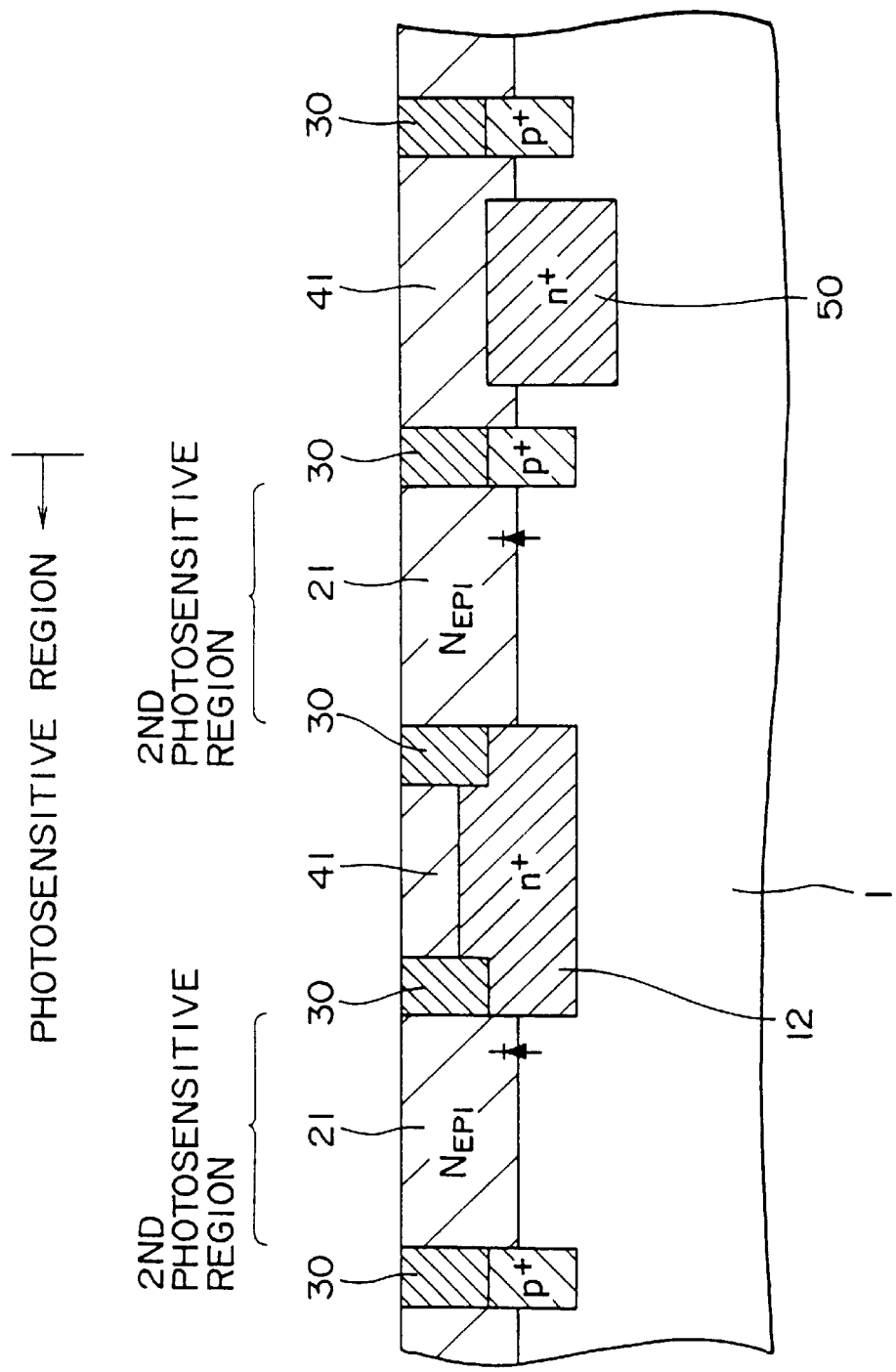
Figure 9D:
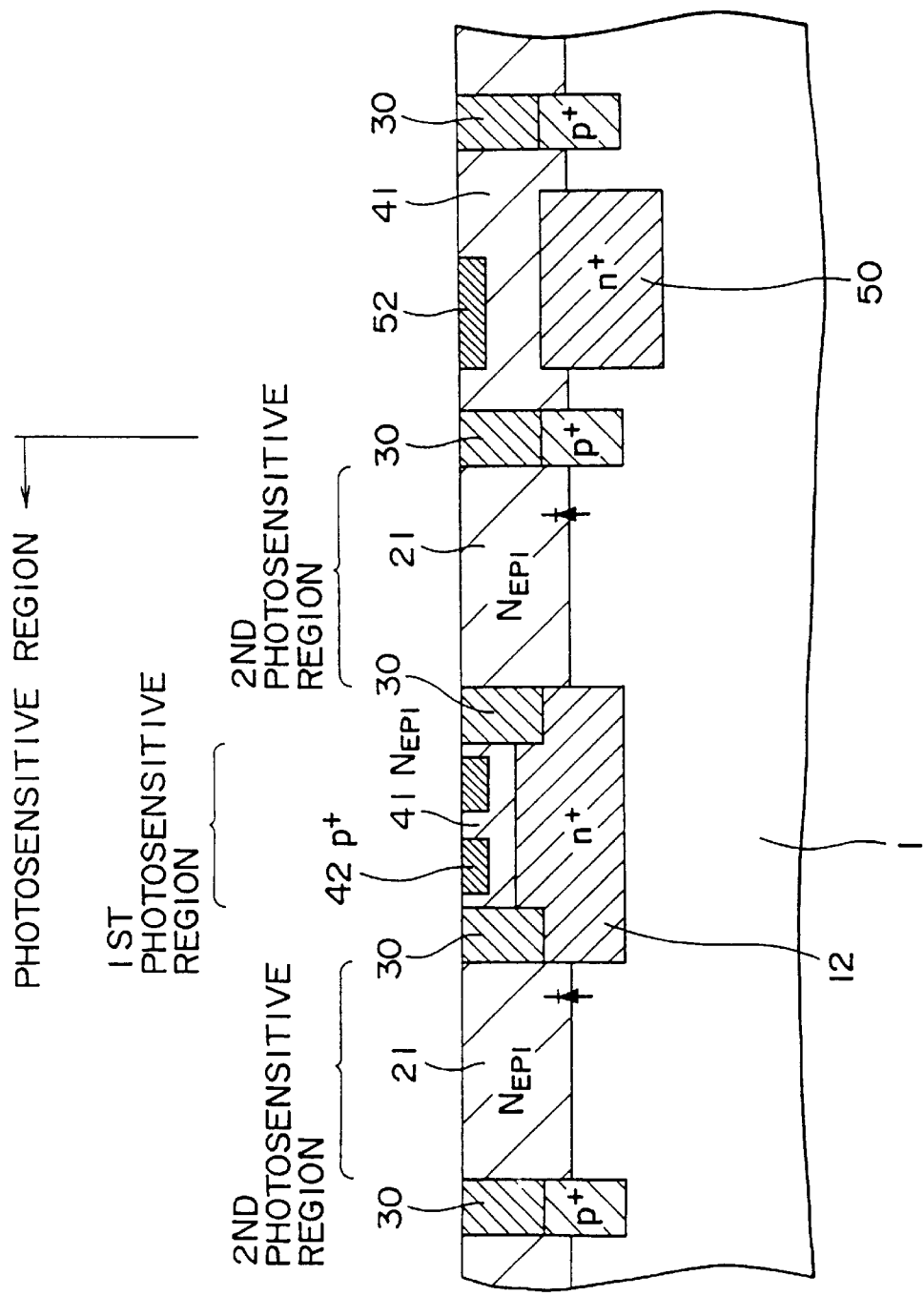

A schematic partial cross-sectional view of the semiconductor device of the embodiment 7 is illustrated in FIG. 8. The structures of the first and second photosensitive regions are similar to the structure of each photosensitive region explained regarding the embodiment 3 a detailed explanation thereof is omitted here. The semiconductor element of the embodiment 7 is also defined as a bipolar transistor, in more practical term, a vertical npn type bipolar transistor formed above the high concentration impurity region 50 of the second conductivity type (n⁺ type) formed on the semiconductor substrate 1 of the first conductivity type (p type).

A method for forming the semiconductor device of the embodiment 7 may substantially be set similar to the method for forming the semiconductor photosensitive element explained with reference to the embodiment 3, except for the point that the method for forming the semiconductor device is included. The method for forming the semiconductor device of the embodiment 7 will then be explained with reference to FIGS. 9A to 9D.

First, a first high concentration impurity region 12 and a second high concentration impurity region 50 of the second conductivity type (n⁺ type) and an element isolation region 30 of the first conductivity type (p⁺ type) are to be formed on a silicon semiconductor substrate 1 of the first conductivity type (p type) (refer to FIG. 9A). For this purpose, a mask (not illustrated) provided with an aperture in the region where the first and second high concentration impurity regions 12 and 50 are to be formed is formed on the surface of the semiconductor substrate 1. The first and second high concentration impurity regions 12 and 50 of the second conductivity type (n⁺ type) are formed by diffusion or ion-implantation of a high concentration n type impurity (for example, boron) into the semiconductor substrate 1. Next, a mask (not illustrated) provided with an aperture in the region where the element isolation region 30 is to be formed is formed on the surface of the semiconductor substrate 1. Thereafter, the element isolation region 30 of the first conductivity type (p⁺ type) is formed by diffusion or ion-implantation of the high concentration p type impurity (for example, boron) into the semiconductor substrate 1. Here, formation of the first and second high concentration impurity regions 12 and 50 and formation of the element isolation region 30 may be inverted in the formation sequence. These high concentration impurity regions 12 and 50 are of the buried type.

Next, a first semiconductor layer 41 of the second conductivity type (n type) is formed on the semiconductor substrate 1 including the element isolation region 30 and first and second high concentration impurity regions 10 and 50 (refer to FIG. 9B). This step may be similar to the analogous step of the embodiment 2.

Thereafter, in order to complete the element isolation region 30, a mask (not illustrated) is provided on the first semiconductor layer 41 above the element isolation region 30 and boron is then ion-implanted thereto. Thereby, the second photosensitive region formed of the photoelectric conversion layer 21 consisting of the first semiconductor layer 41 formed on the semiconductor substrate 1 is formed (refer to FIG. 9C).

Next, with the method of the related arts, a semiconductor element consisting of the vertical npn bipolar transistor is to be formed on the first semiconductor layer 41 above the second high concentration impurity region 50. For this purpose, a base 52 consisting of the p type conductive region is formed by diffusion or ion-implantation of the p type impurity (for example, boron) into the first semiconductor layer 41. Moreover, a second semiconductor layer 42 of the first conductivity type ($p^+$ type) is formed on the first semiconductor layer 41 above the first high concentration impurity region 12 (refer to FIG. 9D). The second semiconductor layer 42 may be formed simultaneously with the base 52 by diffusion or ion-implantation of the p type impurity (for example, boron) into the first semiconductor layer 41. Here, formation of the second semiconductor layer 42 may also be performed before or after the [Step 420], instead of simultaneous formation with the base 52. Thereby, the first photosensitive region, formed of the first high concentration impurity region 12 formed on the semiconductor substrate 1, the photoelectric conversion layer 13 consisting of the first semiconductor layer 41 formed on the first high concentration impurity region 12 and the second semiconductor layer 42 (first conductivity type layer 14) formed on the photoelectric conversion layer 13, may be formed.

Next, the collector 51 and emitter 53 consisting of the $n^+$ type conductive region are formed by diffusion or ion-implantation of the n type impurity (for example, boron) into the first semiconductor layer 41 and a part of the base 52. The semiconductor device illustrated in FIG. 8 may be formed as explained above.

Thereafter, an anode terminal and a cathode terminal (not illustrated) are formed to each photosensitive region with aluminum or aluminum alloy by the known method and the surface of each photosensitive region is covered with a covering material (not illustrated) for the protection purpose. On the other hand, electrodes are formed to the collector 51, base 52 and emitter 53 of the semiconductor element and the semiconductor element is electrically connected as required to each photosensitive region with a wiring 1 consisting of an metal wiring material.

The present invention has been explained on the basis of the preferred embodiments thereof. However, the present invention is not limited thereto and allows, as required, various modifications of numerical values explained in each embodiment and practical method disclosed in each step which are indicated only as the examples. In the embodiments explained above, the first conductivity type is defined as p type, while the second conductivity type as n type, but it is naturally possible to define the first conductivity type as n type, while the second conductivity type as p type. In the embodiments, moreover, a semiconductor element in the semiconductor device has been explained only as an example of the vertical npn type bipolar transistor, but the semiconductor element is not limited thereto and may be explained as a variety of bipolar transistor such as a lateral pnp type bipolar transistor or as a field effect transistor.

The semiconductor photosensitive element or semiconductor device of the present invention can be provided with a first photosensitive region having excellent frequency characteristic and a second photosensitive region having excellent photoelectric conversion characteristic. Thereby, the operation characteristic of the semiconductor photosensitive element or semiconductor device can be optimized, enabling an improvement in the total characteristics of the semiconductor photosensitive element or semiconductor device.

In the method for forming the semiconductor device of the present invention, the manufacturing process, for example, of the bipolar transistor of the related art, the formation process of the element isolation region 30 and the formation process of the semiconductor layer 40 (or first semiconductor layer 41) and the second semiconductor layer 42 may be introduced as the common process. Therefore, the first photosensitive region having excellent frequency characteristic and the second photosensitive region having excellent photoelectric conversion characteristic can be formed together with the semiconductor element only by a slight modification of the conventional manufacturing process of the bipolar transistor.

Moreover, polarity of the signal outputted from the first photosensitive region can be changed by forming the first photosensitive region as the anode terminal common type or as the cathode terminal common type. Thereby, the amplifier for amplifying the signals outputted from the first photosensitive region and the signal processing circuit can be selected from a wider range or the inverter for inverting polarity of signals can be ruled out.

What is claimed is:

1. A semiconductor photosensitive element comprising:
   first and second photosensitive regions,
   whereby said first photosensitive region varies structurally from said second photosensitive region and thereby said first photosensitive region has superior frequency characteristic to said second photosensitive region and said second photosensitive region has superior photoelectric conversion characteristic to said first photosensitive region.

2. A semiconductor photosensitive element as set forth in claim 1, wherein a thickness of said second photosensitive region is set to two to ten times the thickness of said first photosensitive region.

3. A semiconductor photosensitive element as set forth in claim 1, wherein a thickness of said second photosensitive region is set to two to ten times the thickness of said first photosensitive region.

4. A semiconductor photosensitive element as set forth in claim 1, wherein:
   said first photosensitive region consists of a high concentration impurity region of a first conductivity type formed on a semiconductor substrate of the first conductivity type and a photoelectric conversion layer of a second conductivity type formed on said high concentration impurity region;
   said second photosensitive region consists of a photoelectric conversion layer of the second conductivity type, formed on said semiconductor substrate, thicker than the photoelectric conversion layer of said first photosensitive region; and
   respective photosensitive regions are isolated by element isolation regions formed therebetween.

5. A semiconductor photosensitive element as set forth in claim 1, wherein:
   said first photosensitive region consists of a high concentration impurity region of a first conductivity type formed on a semiconductor substrate of the first conductivity type and a photoelectric conversion layer of a second conductivity type formed on said high concentration impurity region;
   said second photosensitive region consists of a photoelectric conversion layer of the second conductivity type, formed on said semiconductor substrate, thicker than the photoelectric conversion layer of said first photosensitive region; and
   respective photosensitive regions are isolated by element isolation regions formed therebetween.

6. A semiconductor photosensitive element as set forth in claim 1, wherein:

said first photosensitive region is composed of a high concentration impurity region of a second conductivity type formed on a semiconductor substrate of the first conductivity type, a photoelectric conversion layer of the second conductivity type formed on said impurity region and a first conductivity type layer formed on said photoelectric conversion layer;

said second photosensitive region is composed of a photoelectric conversion layer of a second conductivity type, formed on said semiconductor substrate, thicker than the photoelectric conversion layer forming said first photosensitive region; and respective photosensitive regions are isolated by the element isolation regions formed therebetween.

7. A semiconductor photosensitive element as set forth in claim 2, wherein a signal processing circuit is formed together with said semiconductor photosensitive element on the same substrate using said semiconductor element.

8. A semiconductor photosensitive element comprising:

first photosensitive regions for detecting digital signals and second photosensitive regions provided for detecting tracking signals, wherein said first photosensitive region varies structurally from said second photosensitive region and thereby said first photosensitive region has superior frequency characteristic to said second photosensitve region and said second photosensitive region has superior photoelectric conversion characteristic to said first photosensitive region.

* * * * *